(12) United States Patent
Godet et al.

(10) Patent No.: US 7,687,787 B2
(45) Date of Patent: Mar. 30, 2010

(54) PROFILE ADJUSTMENT IN PLASMA ION IMPLANTER

(75) Inventors: Ludovic Godet, North Reading, MA (US); George D. Papasouliotis, North Andover, MA (US); Ziwei Fang, Beverly, MA (US); Richard Appel, Danvers, MA (US); Vincent Deno, Gloucester, MA (US); Vikram Singh, North Andover, MA (US); Harold M. Persing, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/267,193

(22) Filed: Nov. 7, 2008

(65) Prior Publication Data

US 2009/0061605 A1 Mar. 5, 2009

Related U.S. Application Data

(63) Continuation-in-part of application No. 11/376,522, filed on Mar. 15, 2006, now Pat. No. 7,528,389.

(60) Provisional application No. 60/662,018, filed on Mar. 15, 2005.

(51) Int. Cl.
H01J 37/317 (2006.01)
H01L 21/265 (2006.01)
H05H 1/24 (2006.01)

(52) U.S. Cl. ............... 250/492.21; 250/492.2; 250/423 R; 250/424; 438/510; 315/111.21; 118/723 E; 118/723 R

(58) Field of Classification Search ............ 250/492.21, 250/492.2, 423 R, 424; 315/111.21; 438/510; 118/723 E, 723 R
See application file for complete search history.

(56) References Cited

U.S. PATENT DOCUMENTS

| 5,734,544 | A | 3/1998 | Johannessen |
| 6,050,218 | A | 4/2000 | Chen et al. |
| 6,182,604 | B1 | 2/2001 | Goeckner et al. |
| 6,784,085 | B2 | 8/2004 | Cuomo et al. |
| 6,893,907 | B2 * | 5/2005 | Maydan et al. ............ 438/149 |
| 6,899,799 | B2 | 5/2005 | Ngan et al. |
| 7,037,813 | B2 | 5/2006 | Collins et al. |
| 7,291,545 | B2 | 11/2007 | Collins et al. |
| 7,294,563 | B2 | 11/2007 | Al-Bayati et al. |

(Continued)

FOREIGN PATENT DOCUMENTS

| EP | 1055745 A1 | 11/2000 |
| WO | 93/18201 A1 | 9/1993 |
| WO | 02/25694 A2 | 3/2002 |

OTHER PUBLICATIONS

Kwok et al., "Energy Distribution and Depth Profile in BF3 Plasma Doping," 2001, pp. 146-150, Surface and Coatings Technology, vol. 136, Elsevier, Amsterdam, Netherlands.
Ho et al., "Preparation of Gallium Nitride (GaN) and Related Compounds by Plasma Immersion Ion Implantation and Rapid Thermal Annealing," 2001, pp. 142-145, Surface & Coatings Technology, vol. 136, Elsevier, Amsterdam, Netherlands.
Chu et al., "Plasma Immersion Ion Implementation—a Fledgling Technique for Semiconductor Processing," 1996, pp. 207-280, Materials Science & Engineering, vol. 17, Elsevier, Amsterdam, Netherlands.

Primary Examiner—Nikita Wells

(57) ABSTRACT

A method to provide a dopant profile adjustment solution in plasma doping systems for meeting both concentration and junction depth requirements. Bias ramping and bias ramp rate adjusting may be performed to achieve a desired dopant profile so that surface peak dopant profiles and retrograde dopant profiles are realized. The method may include an amorphization step in one embodiment.

17 Claims, 7 Drawing Sheets

U.S. PATENT DOCUMENTS

| | | | |
|---|---|---|---|
| 7,303,982 B2 * | 12/2007 | Collins et al. | 438/514 |
| 7,528,389 B2 * | 5/2009 | Fang et al. | 250/492.21 |
| 2003/0116089 A1 | 6/2003 | Walther | |
| 2004/0016402 A1 | 1/2004 | Walther et al. | |
| 2009/0200461 A1 * | 8/2009 | Raj et al. | 250/287 |
| 2009/0227096 A1 * | 9/2009 | Godet et al. | 438/527 |

* cited by examiner

PROFILE ADJUSTMENT IN PLASMA ION IMPLANTER

CROSS-REFERENCE TO RELATED APPLICATIONS

This patent application is a continuation-in-part of U.S. application Ser. No. 11/376,522 entitled "Profile Adjustment in Plasma Ion Implanter," filed Mar. 15, 2006, which claims priority to U.S. Provisional Application No. 60/662,018 entitled "Profile Adjustment in Plasma Ion Implantation," filed Mar. 15, 2005, each of which are hereby incorporated by reference herein in its entirety.

TECHNICAL FIELD

The described apparatus and methods relate generally to providing profile adjustment solutions in plasma doping (PLAD) applications to meet both concentration and junction depth requirements.

BACKGROUND OF THE INVENTION

Plasma doping systems are known and used for forming shallow junctions in semiconductor wafers and for other applications requiring high current with relatively low energy ions. In plasma doping systems, a semiconductor wafer is placed on a conductive platen, which functions as a cathode and is located in a plasma doping chamber. An ionizable doping gas is introduced into the chamber, and a voltage pulse is applied between the platen and an anode or the chamber walls, causing formation of a plasma containing ions of the dopant gas. The plasma has a plasma sheath in the vicinity of the wafer. The applied pulse causes ions in the plasma to be accelerated across the plasma sheath and to be implanted into the wafer. The depth of implantation is related to the voltage applied between the wafer and the anode. Very low implant energies can be achieved. Examples of such plasma doping systems are described in U.S. Pat. No. 5,354,381 to Sheng, U.S. Pat. No. 6,020,592 to Liebert et al., and U.S. Pat. No. 6,182,604 to Goeckner. In the above described plasma doping systems, the applied voltage pulse generates a plasma and accelerates positive ions from the plasma toward the wafer. In other types of plasma systems, a continuous plasma is produced, for example, by inductively-coupled RF power from an antenna located internal or external to the plasma doping chamber. The antenna is connected to an RF power supply. At intervals, voltage pulses are applied between the platen and the anode, causing ions in the plasma to be accelerated toward the wafer.

Dopant gas species used for plasma implantation may decompose or dissociate during the implant process into atomic or molecular fragments which may be deposited on the surface of the wafer. Atomic or molecular fragments that result from dissociation of dopant gas molecules are referred to herein as "neutral particles." Examples of dopant gas species which dissociate during the implant process include $AsH_3$, $PH_3$, $BF_3$, and $B_2H_6$. For example, arsine gas $AsH_3$ may dissociate into As, AsH and $AsH_2$, which may be deposited on the surface of the wafer being implanted. These deposited surface layers can cause a number of problems, including dose non-repeatability, poor dose uniformity and dose measurement problems. In particular, the neutral particles that form the deposited surface layers are not measured by the dose measurement system. Further, the depth profile of the dopant is altered by the deposited surface layer itself and by its effect on implanted ions. In addition, the deposited surface layers can cause contamination of other equipment, such as annealers, when the wafers are subsequently processed in such equipment.

Accordingly, there is a need for providing a profile adjustment solution in plasma doping applications to meet both concentration and junction depth requirements.

SUMMARY OF THE INVENTION

The invention includes methods and apparatuses for providing a dopant profile adjustment solution in plasma doping systems for meeting both concentration and junction depth requirements. Bias ramping and bias ramp rate adjusting may be performed to achieve a desired dopant profile so that shallow and abrupt junction in vertical and lateral directions are realized that are critical to device scaling in plasma doping systems. The ramping of the implanting voltage bias may be linear or non-linear ramping. The rate of ramping the implanting voltage bias may be adjusted and the rate may vary with respect to the deposition rate. Specifically, the rate of ramping the implanting voltage bias may be faster, slower or match the deposition rate. The implanting voltage bias may be ramped in combination with ramping the duty cycle and in combination with changing at least one implant process parameter. The ramping and adjustments are performed to maximize the retained dose and near surface concentration while minimizing dopant spread in vertical and lateral directions.

A first aspect of the invention is directed to a method for plasma implantation of a workpiece comprising the steps of introducing a dopant gas into a plasma doping chamber and ramping an implanting voltage bias to accelerate the dopant gas ions toward the workpiece. The implanting voltage bias is ramped to maximize the retained dose and near surface concentration of the implanted dopant gas ions into the workpiece.

A second aspect of the invention is directed to a plasma doping apparatus comprising a plasma doping chamber, a platen, a gas source and a voltage source for implanting dopant gas ions into a workpiece. The voltage source generates an implanting voltage bias to accelerate the dopant gas ions from the plasma toward the workpiece that is ramped to maximize the retained dose and near surface concentration of the implanted dopant gas ions into the workpiece.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

A box-shape dopant profile is desirable in ion implantation processes for semiconductor device manufacturing. For mono-energetic incident ions, such as those from a beamline implanter, the dopant profile is typically Gaussian. PLAD profiles tend to peak near the surface, with the tail of its profile approaching the beamline tail of the same implant energy. In applications where a certain profile shape is desired, profile adjustment can be made by changing implant energy and dose. In PLAD applications, surface deposition may occur during the implant and by applying a bias voltage that changes with deposition thickness a box-like profile may be achieved. According to one embodiment of the present invention, a method is described to control the ramping and/or rate of ramping the bias voltage in PLAD applications to maximize retained dose and near surface concentration, while minimizing dopant spread in vertical and lateral directions.

During plasma implant processes, deposition typically occurs on the wafer surface due to neutrals and low energy ions from the plasma. This deposition progressively increases through the implant from zero at the beginning of the implant to a small value, 100 Angstroms for instance, towards the end of a high dose implant, such as 2E16 for instance. The depositing film on the wafer surface may impede the penetration depth of the implanting ions which may make the ion implant progressively shallower through the implant process. One embodiment of the present invention compensates for increasing deposition by progressively increasing the implant voltage through the implant step. Such compensating accounts for the fact that the deposition rates are different in different chemistries and conditions. The compensating may be achieved by either a pre-programmed software look up table or an in-situ monitor device installed in the implanting system. By varying the thickness of surface deposition through the plasma implant step, the implant depth of the ions may change accordingly through the plasma implant step. The implant characteristics are thereby changed to make the implant sensitive to dose, bias frequency, pulse width and other process parameters that impacts the implant time.

For typical implant processes, an increase of dopant concentration near the surface may cause a proportional increase at the tail region profile. Junction depths, both vertical and lateral, are sensitive to ion energy and tail concentration. A deep junction usually negative impacts on device performance. For applications that require a high dopant concentration near the surface, a high implant dose is needed but the implant energy is limited by the junction target. One problem for low energy, high dose implants is the resulting low wafer throughput. In PLAD, low energy ions can also be blocked by surface deposition, leading to low retained dose problems. High bias voltages may satisfy the dose target but not the junction target.

Figure 1:
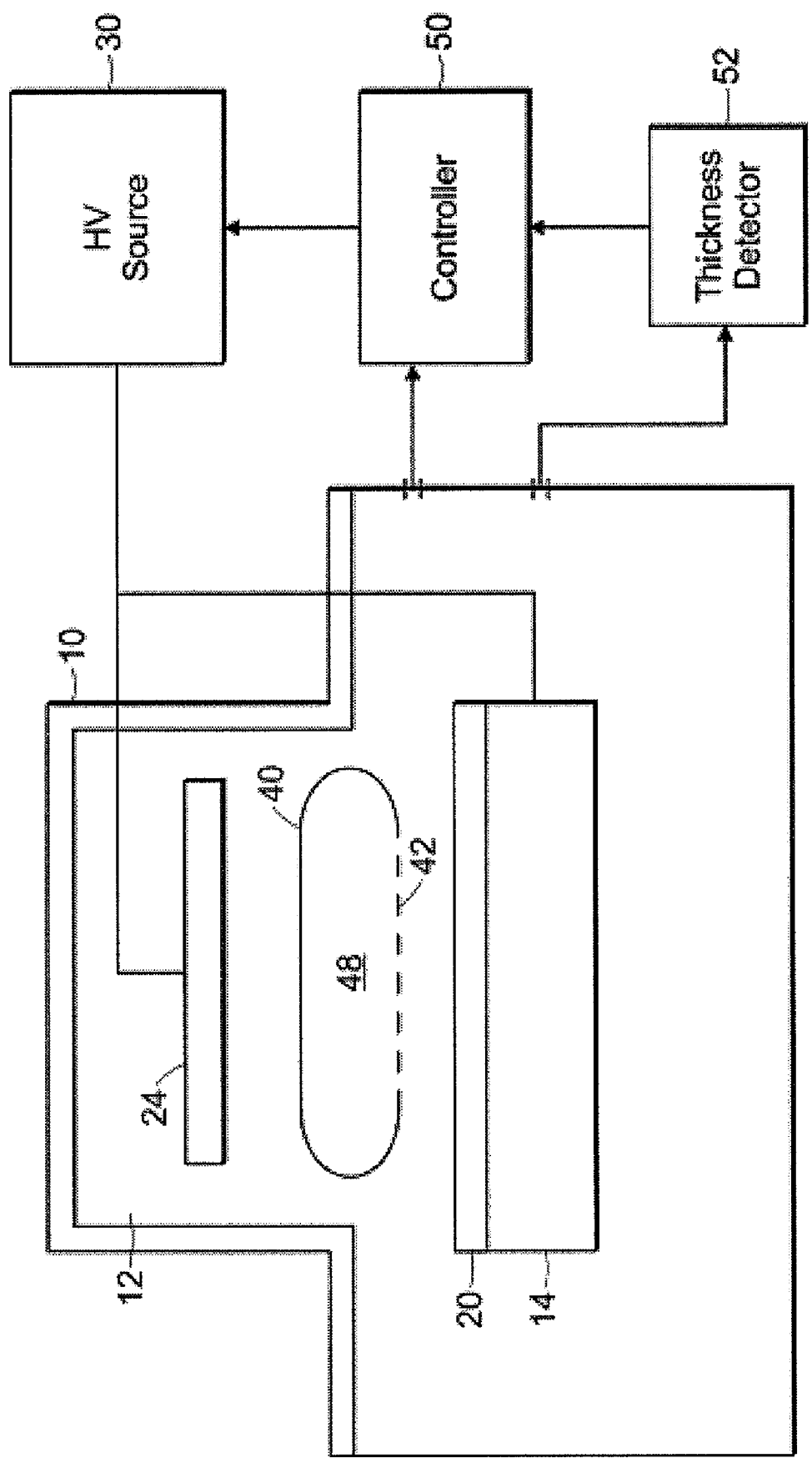
FIG. 1 is a block diagram of a plasma doping system according to an embodiment of the present invention.

High dose or surface concentration is needed to achieve low contact resistance and low spreading resistance. Shallow and abrupt junctions in vertical and lateral directions are critical to device scaling. According to one embodiment of the present invention, a profile adjustment solution for PLAD is provided to meet both concentration and junction depth needs. One example of a plasma ion implantation system suitable for the embodiments of the present invention is illustrated in FIG. 1. A process chamber 10 defines an enclosed volume 12. A platen positioned within the process chamber 10 provides a surface for holding a substrate, such as a semiconductor wafer 20. An anode 24 may be positioned with the process chamber 10 in spaced relation to the platen 14. The anode 24 may be connected to electrically conductive walls of the process chamber 10, both of which may be connected to ground. Alternatively, the platen may be connected to ground, and the anode 24 pulsed to a negative voltage. In further embodiments, both the anode 24 and the platen 14 may be biased with respect to ground. The semiconductor wafer 20 and the anode may be connected to a high voltage source 30 via the platen 14 so that the semiconductor wafer 20 functions as a cathode. The voltage source 30 may provide pulses in a range of about 20 to 20,000 volts in amplitude, for about 1 to 200 µseconds and a pulse repetition rate of about 100 Hz to 20 kHz. However, it should be understood that these pulse parameter values are given by way of example only and other values may be utilized within the scope of the present invention by those skilled in the art.

A controller 50 regulates the rate at which gas is supplied from a gas source (not shown) to the process chamber 10 for supplying an ionizable gas containing a desired dopant for implantation into the semiconductor wafer 20. This configuration provides a continuous flow of process gas at a desired flow rate and constant pressure. It should be realized by those skilled in the art that other configurations may be utilized for regulating gas pressure and flow. A thickness detector 52 communicates with the process chamber 10 and provides the detected information to the controller 50. The thickness detector 52 may be an in-situ film thickness monitor based on reflectivity, however, other known sensors may be used for observing the wafer surface for the deposition rate. The plasma ion implantation system may also include additional components, depending on the configuration of the system. The system typically includes a process control system (not shown) which controls and monitors the components of the plasma ion implantation system to implement a desired implant process. Systems which utilize continuous or pulsed RF energy include an RF source coupled to an antenna or an induction coil. The system may also include magnetic elements which provide magnetic fields that confine electrons and control plasma density and spatial distribution.

In operation, the semiconductor wafer 20 is positioned on the platen 14 and the pressure control system produces the desired pressure and gas flow rate within the process chamber 10. The voltage source 30 applies a series of high voltage pulses to the semiconductor wafer 20, causing formation of a plasma 40 in a plasma discharge region 48 between the semiconductor wafer 20 and the anode 24. The plasma 40 contains positive ions of the ionizable gas and includes a plasma sheath 42 in the vicinity, typically at the surface, of the semiconductor wafer 20. The electric field that is present between the anode 24 and the platen 14 during the high voltage pulse accelerates positive ions from the plasma 40 across the plasma sheath 42 toward the platen 14. The accelerated ions are implanted into the semiconductor wafer 20 to form regions of impurity material. The pulse voltage is selected to implant the positive ions to a desired depth in the semiconductor wafer 20. The number of pulses and the pulse duration are selected to provide a desired dose of impurity material in the semiconductor wafer 20. The current per pulse is a function of pulse voltage, pulse width, pulse frequency, gas pressure and species and any variable position of the electrodes. For example, the cathode to anode spacing may be adjusted for different voltages.

As noted above, dopant gas species typically used for plasma implantation may dissociate into neutral particles during the implant process and form deposited surface layers on the semiconductor wafer 20. Examples of dopant gas species which form deposited surface layers include $AsH_3$, $PH_3$ (phosphine) and $B_2H_6$. Some fluorides such as $BF_3$ may form deposit surface layers under certain plasma doping conditions. For example, arsine gas may dissociate into As, AsH and $AsH_2$, which may be deposited on the surface of the semiconductor wafer 20. Similarly, $BF_3$ may dissociate into B, BF and $BF_2$ which may be deposited on the surface of the semiconductor wafer 20. These deposited surface layers cause dose non-repeatability, poor dose uniformity and metrology problems.

Figure 2A:
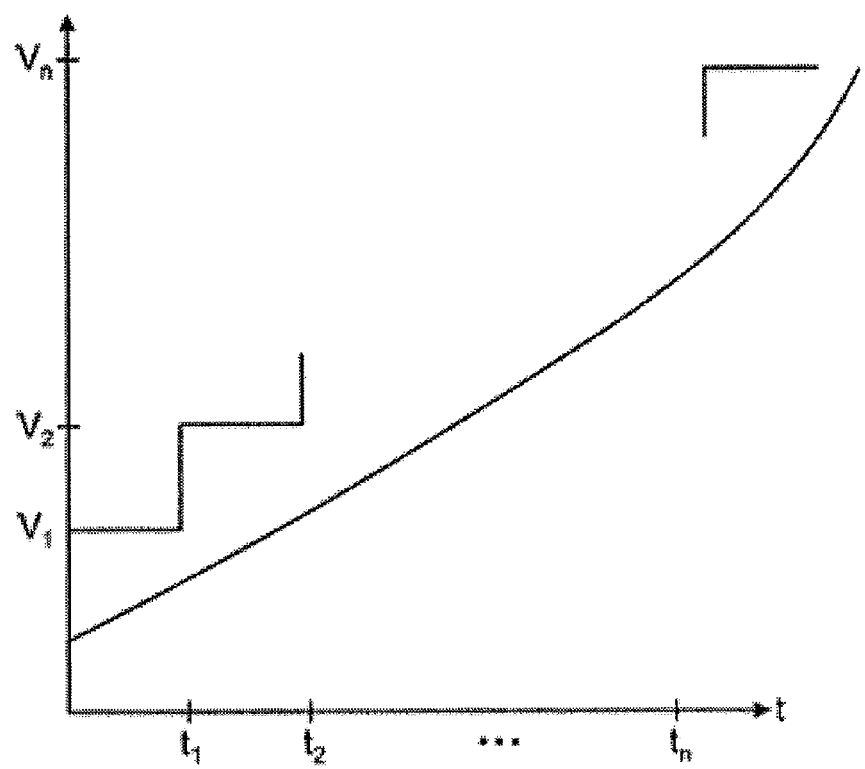
FIGS. 2(a) and 2(b) are graphs of implant ramping bias voltages according to embodiments of the present invention.
Figure 2B:
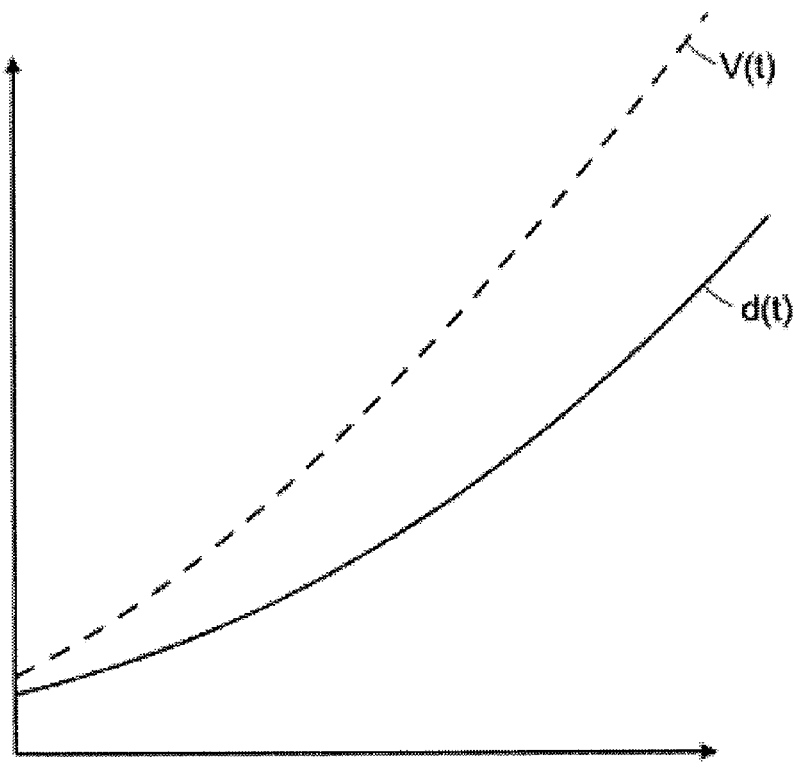

In the present embodiment, the deposition rates as a function of chemistry and plasma doping conditions are characterized. The stopping power of the deposition layer to the incident ions are also characterized. A first implant bias (V1) is used to complete a predetermined first target dose, allowing a first deposition layer to be grown during the first implant period t1 as shown in FIG. 2(*a*). Next a second implant bias (V2) is used to complete a second dose, with the second implant energy adjusted according to the deposition layer thickness. Subsequent implant bias and times are repeated until the total implant dose is reached. The number of iterations, n, may be selected according to the particular application. In characterizing the deposition rates as a function of chemistry and plasma doping conditions, a knowledge base may be developed. The plasma doping system may access this knowledge base for estimating the deposition rate which depends on the recipe required by the implantation process. The implant bias voltage or bias frequency are typically ramped up through the implant process to compensate for the deposition which starts at zero and progressively increases as the implant progresses.

In another embodiment of the present invention, the bias voltage is adjusted continuously, following either a linear or non-linear curve, until the total dose is reached as illustrated in FIG. 2(*b*). A feedback control system, including the in-situ film thickness detector 52 and other process monitors may be used so that the increase of implant bias or frequency is just enough for ions gaining extra momentum to penetrate the surface film. The amount of bias increase may be more or less than what is needed to compensate for the deposition layer to achieve a desired dopant profile.

Figure 3:
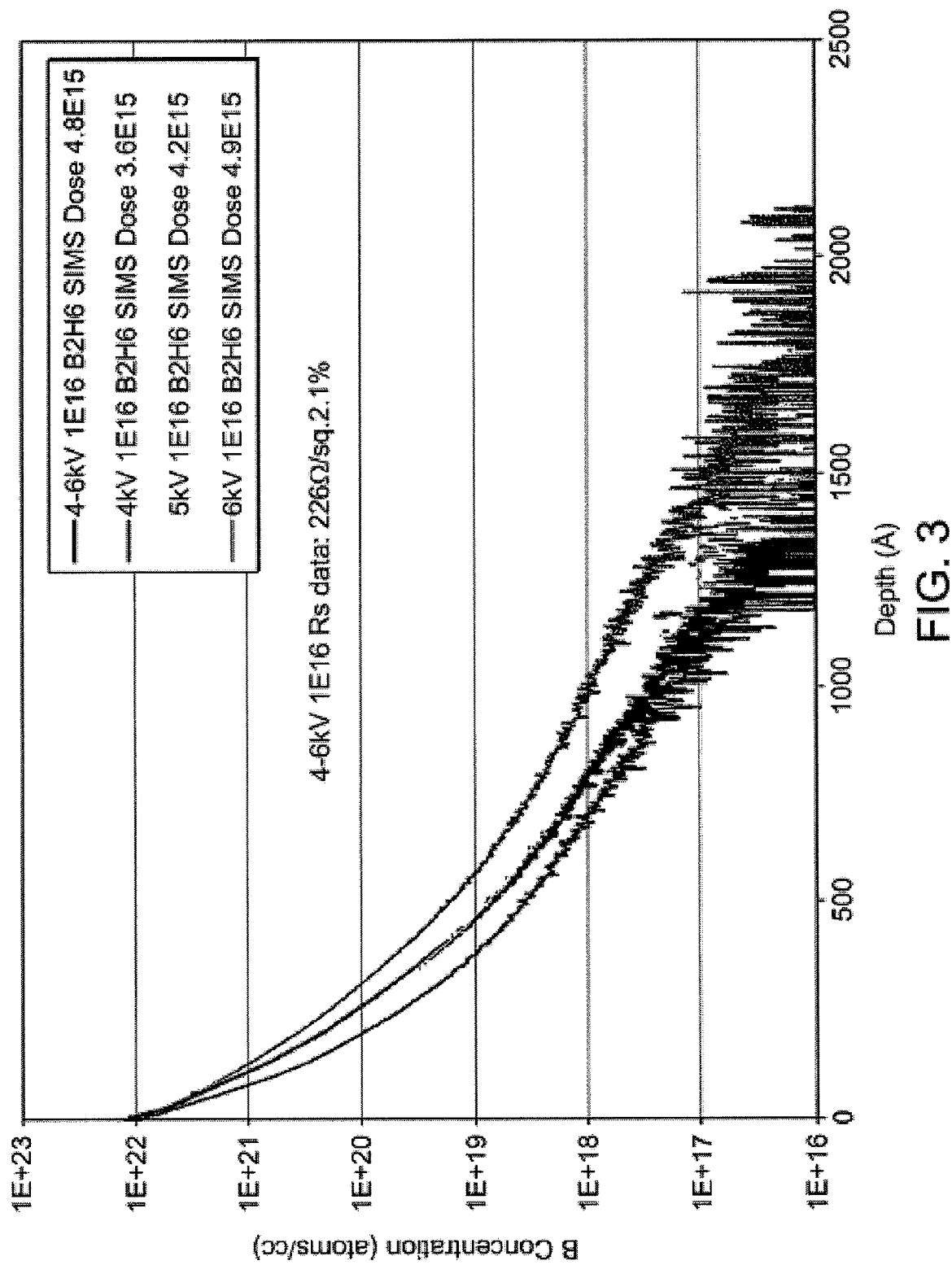
FIG. 3 shows SIMS and Rs data comparison for a five step bias ramping according to one embodiment of the present invention.

In one implementation of the present invention, the method is tested in a $B_2H_6$ plasma doping system with a five-step bias ramping, from 4 kV to 6 kV, with 0.5 kV steps. In FIG. 3, SIMS results show retained dose and surface concentration similar to 6 kV, but junction depths shallower than at 5 kV and these results can be confirmed by Rs data. The embodiments of the present invention may also be implemented for PLAD processes that require a box-like profile, such as ultra-shallow junction (USJ) formation, source drain extensions (SDE), source drain and poly gate doping, and material modification using high dose, low energy implant.

For one aspect of the present invention, the desired dopant profile is achieved by bias ramping. In this embodiment, linear bias ramping tied to the deposition rate is performed and in another embodiment, non-linear bias ramping also tied to the deposition rate is performed to maximize the retained dose. The bias ramping rate may also be adjusted to be faster or slower than the deposition rate. Also, reverse bias ramping may be performed for processes with net etching. The bias ramping may also be combined with duty cycle ramping to prevent wafer surface arcing which may occur at high duty cycle bias ramping. The bias ramping may also be combined with changing one or more process parameters to maximize the retained dose without a deep dopant profile. Examples of process parameters that may be changed include pressure, gas flow, gas composition, RF power, and temperature. It should be realized that other process parameters may be changed and the present invention is not limited by the above referenced process parameters which are provided as some examples. Also, profile engineering in any situation, deposition, etching or none, may be performed for high surface concentration or a deep profile tail. An initial deposition may be performed to reduce channeling. Open and closed loop control may be utilized for bias ramping. In-situ and ex-situ deposition measurements may be used in these control loops.

Figure 4:
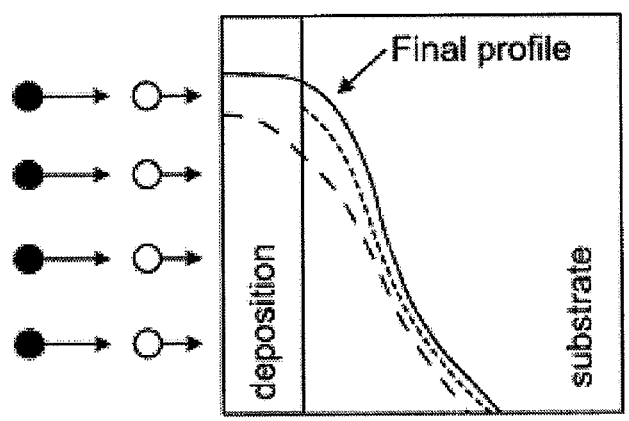
FIG. 4 shows a dopant profile for bias ramping according to one embodiment of the present invention.

As shown in FIG. 4, the bias voltage increases during plasma implantation as indicated by the arrow length. The energy gain for each ion is equivalent to energy loss through the deposition layer so that ion distribution within the substrate remains largely the same. As described above, the increase of bias voltage can be linear or non-linear with time, depending on the deposition rate, which can also be linear or non-linear with time. Accordingly, s the retained dose is maximized without a deep dopant profile.

Figure 5A:
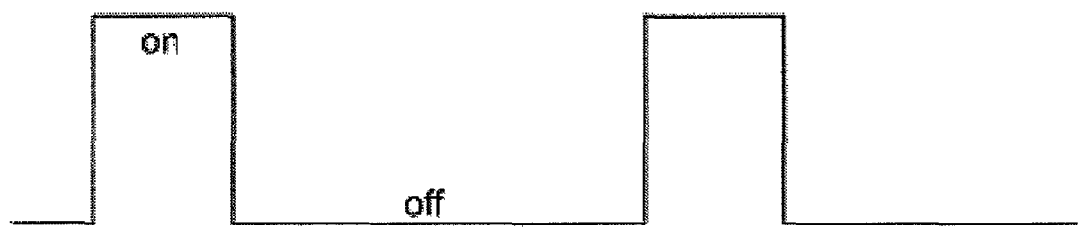
FIGS. 5(a), 5(b), and 5(c) show bias ramping combined with duty cycle ramping according to embodiments of the present invention.
Figure 5B:
Figure 5C:
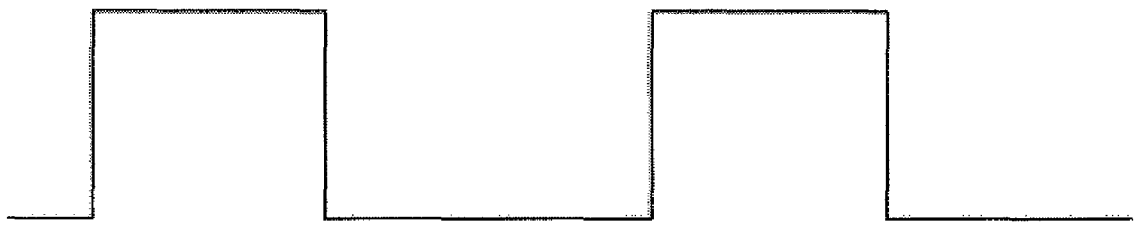

FIGS. 5(*a*), 5(*b*), and 5(*c*) illustrate bias ramping combined with duty cycle ramping for achieving a higher duty cycle at lower ramping bias for improving wafer throughput and photo-resist conditioning of the wafers. The bias voltage is applied only during the "on" period as shown in FIG. 5(*a*). However, the amplitude of the bias voltage may be controlled separated by the controller 50. Also, the bias voltage may start with a lower duty cycle as shown in FIG. 5(*b*) and end with a higher duty cycle as shown in FIG. 5(*c*) or the bias voltage may start with the higher duty cycle of FIG. 5(*c*) and end with the lower duty cycle of FIG. 5(*b*).

Figure 6:
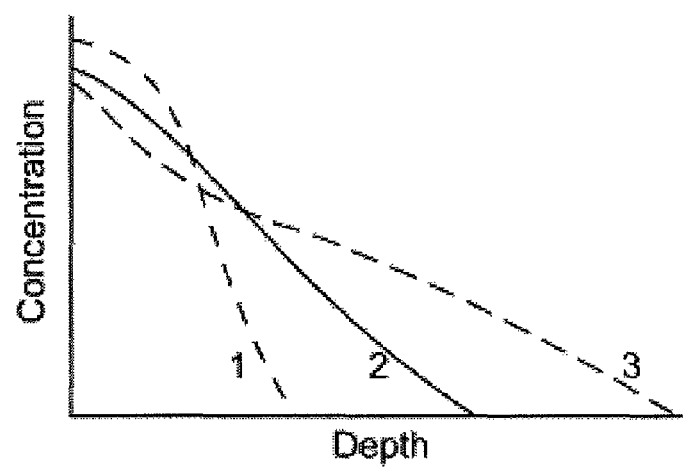
FIG. 6 shows effects on the dopant profile for various deposition rates tied with the bias ramping according to embodiments of the present invention.

FIG. 6 illustrates the effects on the dopant profile when the bias ramping is varied with respect to the deposition rate. In FIG. 6, line I shows bias ramping that is slower than the deposition rate, line II shows bias ramping that matches the deposition rate and line III shows bias ramping that is faster than the deposition rate. For lowering contact resistance, a surface peaked profile is desired while a shallow or deeper profile is desirable for junction depth control and activation.

Figure 7:
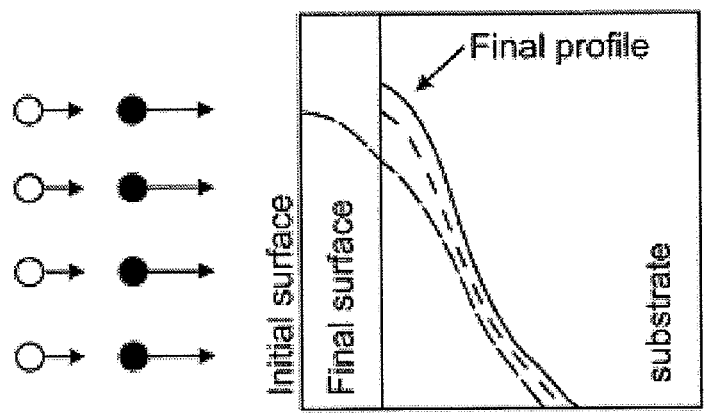
FIG. 7 shows a junction profile for reverse bias ramping according to an embodiment of the present invention.

FIG. 7 illustrates an embodiment of the present invention which utilizes reverse bias ramping in a process with net surface etching. The ion energy is reduced to match the surface removal rate so that ion distribution within the substrate remains largely the same. Again, the decrease of the bias voltage can be linear or non-linear with time, depending on the surface removal rate. Accordingly, the retained dose is maximized without a deep dopant profile resulting.

Figure 8:
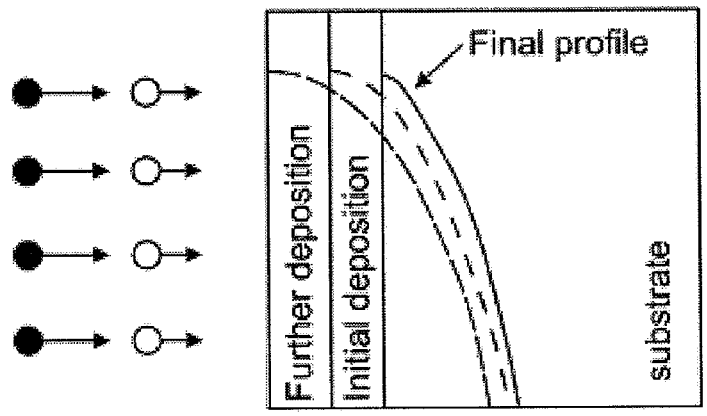
FIG. 8 shows a junction profile for bias ramping with a process having an initial deposition according to an embodiment of the present invention.

FIG. 8 illustrates an embodiment of the present invention in which an initial deposition may be made without a bias voltage being applied for a predetermined amount of time. When a single crystal substrate is used, the channeling tail may be reduced or even eliminated due to the angular spread of ions penetrating the initial deposition layer. Thereby, channeling may be reduced without the need of pre-amorphization implant which is critical for USJ formation in SDE doping. Also, the dopant lateral distribution can be modeled with the knowledge of incident ion energy, flux and deposition rate.

In another embodiment, an amorphizing implant is performed. An amorphizing implant will alter or destroy the long-range order of the positions of the atoms in a crystal lattice. Dopant species such as B, P, or As or electrically-inert species such as H, N, He, Ar, Ne, Kr, or Xe may be used to amorphize the crystal lattice. Larger atoms such as Si or Ge also may be used to amorphize the crystal lattice. The amorphous state of the crystal lattice may later be changed from an amorphous state to a crystalline state using an anneal. Thus, any damage caused by the amorphizing implant may be repaired.

The amorphizing implant may be a pre-amorphizing implant (PAI) performed prior to doping the workpiece. An amorphizing implant also may occur during the doping of the workpiece. This may be known as a "self-amorphizing" implant. For example, a "self-amorphizing" implant may implant B and He at least partially simultaneously. The He will amorphizing the crystal lattice while the B dopes the workpiece.

Amorphizing the crystal lattice allows the resulting dopant profile to be tailored. In one example, a He PAI is performed prior introducing the dopants. As the crystal lattice becomes amorphous and no longer has an ordered structure, effects such as channeling of dopants, or the implantation of ions substantially between the crystal lattice of the substrate, during later implantation may be prevented or reduced. This is because an organized or ordered crystal lattice may no longer exist.

The resulting amorphized region of the crystal lattice will form a sort of barrier hindering movement of subsequently implanted dopants. One or more dopants will be implanted into the amorphized region and will substantially stop at the interface separating the amorphous and crystalline regions (amorphous-crystalline interface). The dopant also may not diffuse past this amorphous-crystalline interface either during implantation or during an anneal.

Use of an amorphizing implant or PAI may allow formation of different profiles. If the amorphizing implant or PAI is performed prior to implanting a dopant, the resulting dopant profile may either have a surface peak profile or a retrograde profile. In one embodiment, the amorphizing implant or PAI is performed to form an amorphous region near the surface of the workpiece. In the process, the amorphous-crystalline interface also may be located near the surface of the workpiece. Subsequent implantation of dopants will result in a surface peak dopant profile (similar to that illustrated in FIG. 6).

Figure 9:
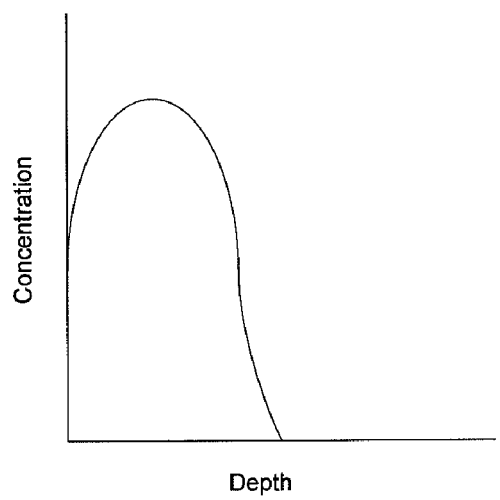
FIG. 9 shows a retrograde junction profile.

In yet another embodiment, a retrograde dopant profile is formed. For example, an amorphizing implant or PAI is performed so that the amorphous-crystalline interface is formed deeper in the workpiece. Subsequent doping implants will result in the formation of a retrograde dopant profile. FIG. 9 shows a retrograde junction profile. As illustrated in FIG. 9, the peak dopant concentration does not occur at the surface of the workpiece. Rather, the peak dopant concentration occurs below the surface of the workpiece.

Bias ramping may be combined with the amorphizing implant or PAI to form a retrograde profile. For example, a first bias level is applied to the workpiece to amorphize a region of the crystal structure of the workpiece. This amorphizing implant or PAI may be at a high energy and a low dose or low concentration. The dopant gas concentration in one instance is less than approximately 0.05%. Then, the bias voltage may be ramped down to form the retrograde profile. Ramping down may be equivalent to reverse biasing. The bias voltage in one embodiment does not ramp down to zero. For example, the first bias level may be approximately 350 V or 375 V and the second bias level may be approximately 250 V. In another example, the first bias level may be approximately 500 V and the second bias level may be approximately 350 V.

Other bias levels and dopant concentrations are possible and the embodiments of the process described herein are not solely limited to the examples disclosed.

In one particular embodiment, a first bias level is applied to a workpiece to amorphize a region of the crystal structure of the workpiece. Then the workpiece has a second bias level applied to it, ramping down from the first bias level to the second bias level to implant ions and form a retrograde dopant profile in the workpiece. In one instance, only a single gas is used for both the amorphizing and doping. This single gas is a dopant species. In another instance, at least two gases are used. In this instance, a first gas is used at the first bias level. This first gas may be a dopant species or an electrically-inert species. A second gas is introduced prior to or at least partially simultaneously with the second bias level. This second gas is a dopant species.

A retrograde dopant profile may be formed without an amorphizing implant or PAI. For example, the retrograde profile may be formed by controlling the bias voltage. The bias voltage of may be ramped down to place the dopants at the proper depth in the workpiece and form the retrograde dopant profile.

Bias ramping and bias ramp rate adjusting may be performed to achieve a retrograde profile. This ramping may be linear or non-linear ramping. Increased bias voltage may result in a greater depth of amorphization and, consequently, a deeper retrograde profile. Implant process parameters such as pressure, gas flow, gas composition, RF power, or temperature also may be changed.

Figure 10:
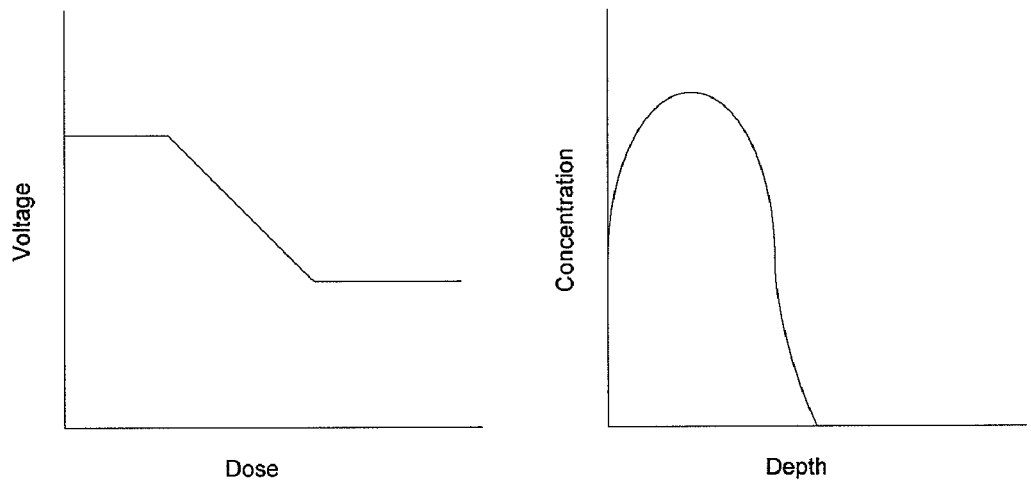
FIG. 10 shows a ramping bias voltage and resulting retrograde junction profile.
Figure 11:
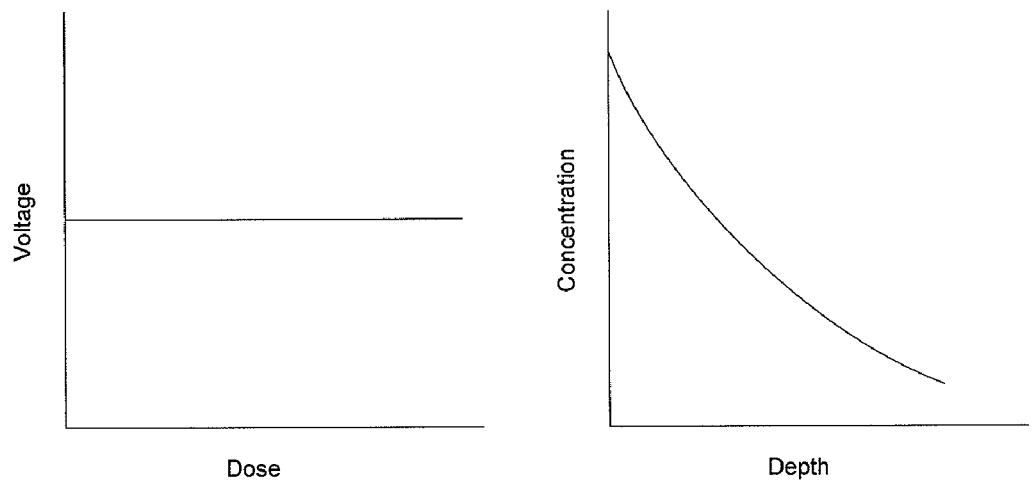
FIG. 11 shows a non-ramping bias voltage and resulting surface peak dopant profile.

FIG. 10 shows a ramping bias voltage and resulting retrograde junction profile. There is a first bias level and a second bias level. In one instance, the first bias level may be applied for 25% of the total implant, the second bias level may be applied for 25% of the total implant, and the ramping period may be 50% of the total implant. A retrograde dopant profile will be formed. FIG. 11 shows a non-ramping bias voltage and resulting surface peak dopant profile. Only a single bias voltage is applied. This results in a surface peak dopant profile. The difference in depth between the dopant profiles in FIGS. 10 and 11 may be the channeling component. This channeling tail that extends deep into the dopant profile may be eliminated if an amorphizing implant or PAI is performed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for plasma processing of a workpiece comprising:
   forming a plasma containing ions of a dopant gas;
   applying a first bias level to said workpiece; and
   ramping from said first bias level to a second bias level to implant said ions, said implant is configured to form a retrograde dopant profile in said workpiece.

2. The method of claim 1, wherein said ramping comprises non-linear ramping.

3. The method of claim 1, wherein said ramping comprises linear ramping.

4. The method of claim 1, wherein a rate of ramping is adjusted.

5. The method of claim 1, further comprising amorphizing a region of a crystal structure of said workpiece.

6. A method for plasma processing of a workpiece comprising:
   forming a plasma containing ions of a first gas;
   applying a first bias level to said workpiece;
   amorphizing a region of a crystal structure of said workpiece at said first bias level; and
   ramping down from said first bias level to a second bias level to implant said ions, said implant configured to form a retrograde dopant profile in said workpiece.

7. The method of claim 6, wherein said ramping down comprises non-linear ramping.

8. The method of claim 6, wherein said ramping down comprises linear ramping.

9. The method of claim 6, wherein a rate of ramping is adjusted.

10. The method of claim 6, further comprising preventing channeling of said ions in said crystal structure of said workpiece.

11. The method of claim 6, wherein said method further comprises changing at least one implant process parameter.

12. The method of claim 11, wherein said at least one implant process parameter comprises pressure, gas flow, gas composition, RF power, and temperature.

13. The method of claim 6, wherein said ramping down comprises reverse biasing of said workpiece.

14. The method of claim 6, wherein said workpiece is a semiconductor wafer.

15. The method of claim 6, further comprising introducing a second gas prior to said ramping down, said second gas containing a dopant species.

16. The method of claim 6, wherein said first gas is of at least one of an electrically-inert species and a dopant species.

17. A method for plasma processing of a workpiece comprising:
   forming a plasma containing ions of a first gas
   applying a first bias level to said workpiece;
   amorphizing a region of a crystal structure of said workpiece at said first bias level; and
   ramping said first bias level to a second bias level to implant said ions, said implant configured to form at least one of a surface peak dopant profile and retrograde dopant profile in said workpiece.

* * * * *